United States Patent
Sung et al.

(10) Patent No.: US 6,252,419 B1
(45) Date of Patent: Jun. 26, 2001

(54) LVDS INTERFACE INCORPORATING PHASE-LOCKED LOOP CIRCUITRY FOR USE IN PROGRAMMABLE LOGIC DEVICE

(75) Inventors: Chiakang Sung, Milpitas; Bonnie I. Wang, Cupertino; Richard G. Cliff, Milpitas, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/368,464

(22) Filed: Aug. 4, 1999

Related U.S. Application Data

(60) Provisional application No. 60/115,215, filed on Jan. 8, 1999.

(51) Int. Cl.[7] .......................... H03K 19/173; H03K 3/02; H03L 7/06

(52) U.S. Cl. .............................. 326/38; 326/38; 326/39; 326/40; 326/41; 327/156; 327/198

(58) Field of Search ................................ 326/37, 38, 39, 326/40, 41

(56) References Cited

U.S. PATENT DOCUMENTS

| | | | |
|---|---|---|---|
| Re. 35,797 | 5/1998 | Graham et al. | 326/40 |
| 4,494,021 | 1/1985 | Bell et al. | 307/591 |
| 4,633,488 | 12/1986 | Shaw | 375/120 |

(List continued on next page.)

FOREIGN PATENT DOCUMENTS

| | | |
|---|---|---|
| 0 266 065 | 9/1987 | (EP) . |
| 0 416 930 | 3/1991 | (EP) . |
| 0 778 517 | 6/1997 | (EP) . |
| 1-137646 | 5/1989 | (JP) . |

OTHER PUBLICATIONS

Advanced Micro Devices, Inc., "Am2971 Programmable Event Generator (PEG)," Publication No. 05280, Rev. C, Amendment /0, pp. 4–286–4–303 (Jul. 1986).

Advanced Micro Devices, Inc., "AmPAL*22S8 20–Pin IMOX PAL–Based Sequencer," Publication No. 06207, Rev. B, Amendment /0, pp. 4–102–4–121 (Oct. 1986).

Ko, U., et al., "A 30–ps Jitter, 3.6 $\mu$s Locking, 3.3–Volt Digital PLL for CMOS Gate Arrays," Proceedings of the IEEE 1993 Custom Integrated Circuits Conference, Publication No. 0–7803–0826–3/93, pp. 23.3.1–23.3.4 (May 9–12, 1993).

Monolithic Memories, Inc., "Programmable Array Logic PAL20RA10–20 Advance Information," pp. 5–95–5–102 (Jan. 1988).

DynaChip Corp., "Application Note: Using Phase Locked Loops in DL6035 Devices" (1998).

DynaChip Corp., DY6000 Family Datasheet (Dec. 1998).

LSI Logic Corp., 500K Technology Design Manual (Document DB04–000062–00, First Edition), pp. 8–1–8–33 (Dec. 1996).

(List continued on next page.)

*Primary Examiner*—Michael Tokar
*Assistant Examiner*—Vibol Tan
(74) *Attorney, Agent, or Firm*—Fish & Neave; Jeffrey H. Ingerman

(57) ABSTRACT

An LVDS interface for a programmable logic device uses phase-locked loop ("PLL") circuits to provide data clocks for data input and output. The PLL clocks are highly accurate and each includes a multiply-by-W counter so that a multiplied and an unmultiplied clock are available. The multiplied clock is used to clock data into or out of a shift register chain serially. The unmultiplied clock is used to load or read the registers in the shift register chain in parallel. Providing both the multiplied and unmultiplied clocks from a single PLL assures that the clocks are in proper phase relationship so that the serial inputting or outputting, and the parallel loading or unloading, are properly synchronized.

44 Claims, 6 Drawing Sheets

U.S. PATENT DOCUMENTS

| | | | |
|---|---|---|---|
| 4,719,593 | 1/1988 | Threewitt et al. | 364/900 |
| 4,868,522 | 9/1989 | Popat et al. | 331/2 |
| 4,959,646 | 9/1990 | Podkowa et al. | 340/825.83 |
| 5,072,195 | 12/1991 | Graham et al. | 331/2 |
| 5,075,575 | 12/1991 | Shizukuishi et al. | 307/465 |
| 5,079,519 | 1/1992 | Ashby et al. | 331/1 A |
| 5,133,064 | 7/1992 | Hotta et al. | 395/550 |
| 5,204,555 | 4/1993 | Graham et al. | 307/465 |
| 5,349,544 | 9/1994 | Wright et al. | 364/600 |
| 5,397,943 | 3/1995 | West et al. | 326/39 |
| 5,418,499 | 5/1995 | Nakao | 331/57 |
| 5,420,544 | 5/1995 | Ishibashi | 331/11 |
| 5,506,878 | 4/1996 | Chiang | 377/39 |
| 5,542,083 | 7/1996 | Hotta et al. | 395/550 |
| 5,646,564 | 7/1997 | Erickson et al. | 327/158 |
| 5,656,959 * | 8/1997 | Chang et al. | 327/105 |
| 5,699,020 | 12/1997 | Jefferson | 331/17 |
| 5,742,180 | 4/1998 | DeHon et al. | 326/40 |
| 5,744,991 * | 4/1998 | Jefferson et al. | 327/158 |
| 5,777,360 | 7/1998 | Rostoker et al. | 257/315 |
| 5,815,016 | 9/1998 | Erickson | 327/158 |
| 5,847,617 | 12/1998 | Reddy et al. | 331/57 |
| 5,900,757 * | 5/1999 | Aggarwal et al. | 327/198 |
| 5,987,543 * | 11/1999 | Smith | 710/70 |
| 6,014,048 * | 1/2000 | Talaga, Jr. et al. | 327/156 |
| 6,069,506 * | 5/2000 | Miller, Jr. et al. | 327/156 |
| 6,069,507 * | 5/2000 | Shen et al. | 327/156 |

OTHER PUBLICATIONS

Lucent Technologies, Inc., Optimized Reconfigurable Cell Array (OCRA®) OR3Cxxx/OR3Txxx Series Field–Programmable Gate Arrays, Preliminary Product Brief, (Nov. 1997).

Lucent Technologies, Inc., OCRA® Series 3 Field–Programmable Gate Arrays, Preliminary Data Sheet, Rev. 01 (Aug. 1998).

National Semiconductor Corp., *LVDS Owner's Manual & Design Guide* (Apr. 25, 1997).

National Semiconductor Corp., "DS90CR285/DS90CR286 +3.3V Rising Edge Data Strobe LVDS 28–Bit Channel Link–66 MHZ," (Mar. 1998).

Xilinx, Inc., Virtex 2.5V Field Programmable Gate Arrays Advance Product Specification (Version 1.0) (Oct. 20, 1998).

Xilinx, Inc., Application Note: Using the Virtex Delay–Locked Loop (Version 1.31) (Oct. 21, 1998).

Zaks, R., et al., From Chips to Systems: An Introduction to Microcomputers, pp. 54–61 (Prentice–Hall Inc., Englewood Cliffs, N.J., 1987).

* cited by examiner

LVDS INTERFACE INCORPORATING PHASE-LOCKED LOOP CIRCUITRY FOR USE IN PROGRAMMABLE LOGIC DEVICE

CROSS REFERENCE TO RELATED APPLICATION

This claims the benefit of copending, commonly-assigned U.S. Provisional Patent Application No. 60/115,215, filed Jan. 8, 1999.

BACKGROUND OF THE INVENTION

This invention relates to an LVDS interface, incorporating phase-locked loop circuitry, for use in a programmable logic device. More particularly, this invention relates to an LVDS interface having a phase-locked loop circuit to control the shifting of data at high speeds.

Programmable logic devices are well known. Commonly, a programmable logic device has a plurality of substantially identical logic elements, each of which can be programmed to perform certain desired logic functions. The logic elements have access to a programmable interconnect structure that allows a user to interconnect the various logic elements in almost any desired configuration. Finally, the interconnect structure also provides access to a plurality of input/output ("I/O") pins, with the connections of the pins to the interconnect structure also being programmable.

At one time, programmable logic devices of the type just described were implemented almost exclusively using transistor-transistor logic ("TTL"), in which a logical "high" signal was nominally at 5 volts, while a logical "low" signal was nominally at ground potential, or 0 volts. More recently, however, other logic standards have come into general use, some of which use different signalling schemes, such as LVTTL (Low Voltage TTL), PCI (Peripheral Component Interface), SSTL (Series Stub Terminated Logic, which has several variants), GTL (Gunning Transceiver Logic) or GTL+, HSTL (High Speed Transceiver Logic, which has several variants), LVDS (Low voltage Differential Signalling), and others. Some of these signalling schemes, and particularly LVDS, require high-frequency clock signals with precise phase relationships for proper operation.

It is known to include phase-locked loop circuitry on programmable logic devices to help counteract "skew" and excessive delay in clock signals propagating on the device (see, for example, Jefferson U.S. Pat. No. 5,699,020 and Reddy et al. U.S. Pat. No. 5,847,617, both of which are hereby incorporated by reference herein in their entireties). For example, phase-locked loop circuitry may be used to produce a clock signal which is advanced in time relative to a clock signal applied to the programmable logic device. The advanced clock signal is propagated to portions of the device that are relatively distant from the applied clock signal so that the propagation delay of the advanced clock signal brings it back into synchronism with the applied clock signal when it reaches the distant portions of the device. In this way all portions of the device receive synchronous clock signals and clock signal "skew" (different amounts of delay in different portions of the device) is reduced.

However, while phase-locked loops are accurate sources of clock signals, they generally are limited in the frequencies they can provide, both in terms of adjustability, and in terms of the absolute range of frequencies that can be generated. This has limited the speed of LVDS interfaces.

It would be desirable to be able to provide an LVDS interface for a programmable logic device, which interface includes a phase-locked loop circuit for accurate input/output timing.

SUMMARY OF THE INVENTION

It is an object of this invention to attempt to provide an LVDS interface for a programmable logic device, which interface includes a phase-locked loop circuit for accurate input/output timing.

In accordance with the present invention, there is provided an LVDS input interface for a programmable logic device having a plurality of signal conductors. The LVDS interface includes a pair of input terminals for accepting an input LVDS signal, and an LVDS differential input driver for converting the input LVDS signal into a data signal comprising a serial stream of data bits. A number of shift registers are provided, having a shift register input for accepting the serial stream of data bits, and each of the shift registers has a shift register output. The same number of second registers are also provided, each register in that number of second registers having an input coupled to one of the shift register outputs and having a registered output coupled to one of the signal conductors. An input phase-locked loop circuit generates first and second input clock signals having first and second input clock rates, with the first input clock rate being a multiple of the second input clock rate, where the multiple is an integer that at most equals that number. The first input clock signal controls shifting of the serial stream of data bits into the first shift registers, and the second input clock signal controls registration of the data bits from the inputs of the second registers to the outputs of the second registers. On each one cycle of the second clock signal, (a) an existing set of that multiple of data bits previously applied in parallel by the shift register outputs to the inputs of the second registers are registered to the outputs of the second registers for conduction in parallel onto the signal conductors, and (b) the first input clock signal goes through that multiple of cycles, clocking a new set of that number of data bits into the shift registers, whence they are conducted to the inputs of the second registers.

An LVDS output interface for the programmable logic device is also provided, and includes a number of first registers, each register in that number of first registers having an input coupled to one of the signal conductors and having a registered output. That number of shift registers is also provided, each shift register in that number of shift registers having an input coupled to one of the registered outputs, and the shift registers having a shift register output for providing a serial stream of data bits. An output phase-locked loop circuit generates first and second output clock signals having first and second output clock rates. The second output clock rate is a multiple of the first output clock rate, where the multiple is an integer at most equal to that number. An LVDS differential output driver converts the serial stream of data bits into an output LVDS signal, which is conducted to a pair of output terminals. The first output clock signal controls registration of the data bits from the inputs of the first registers to the registered outputs, whence they are conducted to the inputs of the shift registers. The second output clock signal controls shifting of the data bits out of the shift registers as the serial stream of data bits. On each one cycle of said first output clock signal, (a) the second output clock signal goes through that multiple of cycles, clocking a set of that multiple of data bits out the shift registers as the serial stream of data bits, and (b) an existing set of that multiple of data bits previously conducted by the signal conductors into the first registers are registered to the registered outputs of the first registers whence they are conducted in parallel to the shift registers, while a new set of that multiple of data bits are conducted into the inputs of the first registers by the signal conductors.

The input and output phase-locked loop circuits allow high speed LVDS operation by providing accurate, synchronized clock signals that allow a selected number of bits to be clocked between a shift register chain and a set of parallel registers. It is readily understood that the clock that controls the clocking of data serially into or out of the shift registers must be an exact multiple of the clock that controls the clocking of data in parallel mode into or out of the shift registers. If the serial clock runs too slowly, not all of the serial data will be clocked into or out of the shift registers before the next parallel transfer of data. Similarly, if the serial clock runs too quickly, the system will attempt to clock more data than are available into or out of the shift registers before the next parallel transfer occurs. On the input side, the system will attempt to clock more data into the shift registers before the system is ready to transfer it into the programmable logic device in parallel, with the result that some of the data already in the shift registers may be clocked out too soon and be lost. Similarly, on the output side, the system may attempt to clock data out of the shift registers to provide serial output of the programmable logic device even before the data have been transferred in parallel from the programmable logic device to the shift registers, with the result that the output data stream will contain gaps or erroneous data.

The present invention avoids these difficulties by providing specialized, dedicated high-speed phase-locked loop-based clocks specifically for use with high-speed LVDS interfaces. The clock signals are provided elsewhere on the device to the extent that they may be required in connection with use of the LVDS data, but the clocks are not intended for general use. Other phase-locked loop-based clocks are provided that are meant for general use. Those other clocks are adjustable and are described in copending, commonly-assigned U.S. patent application Ser. Nos. 60/115,238, filed Jan. 8, 1999 and 09/366,940, filed Aug. 4, 1999. Unlike those clocks, however, the clocks according to present invention are built for accuracy, with no adjustable components provided that might give rise to inaccuracies, as described below.

A phase-locked loop-based clock circuit according to the invention preferably is provided with a programmable, or loadable, "divide-by-w" feedback-scale counter in its feedback loop. This allows the clock circuit to provide two clock outputs—a first output at a lower frequency, and a second output at a higher frequency, equal to W times the lower frequency, with the two clock outputs in phase-locked relationship, either with or without a predetermined non-zero phase shift, as described below. If W is the number of bits of data transferred in parallel (i.e., the "word" size), this allows an entire word to be clocked serially into or out of an input or output shift register chain under the control of the high-speed clock precisely in the time it takes to transfer the word in parallel between the logic of the programmable logic device and the shift register chain, preventing the loss of data that might result if the clocks were not substantially perfectly synchronized.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
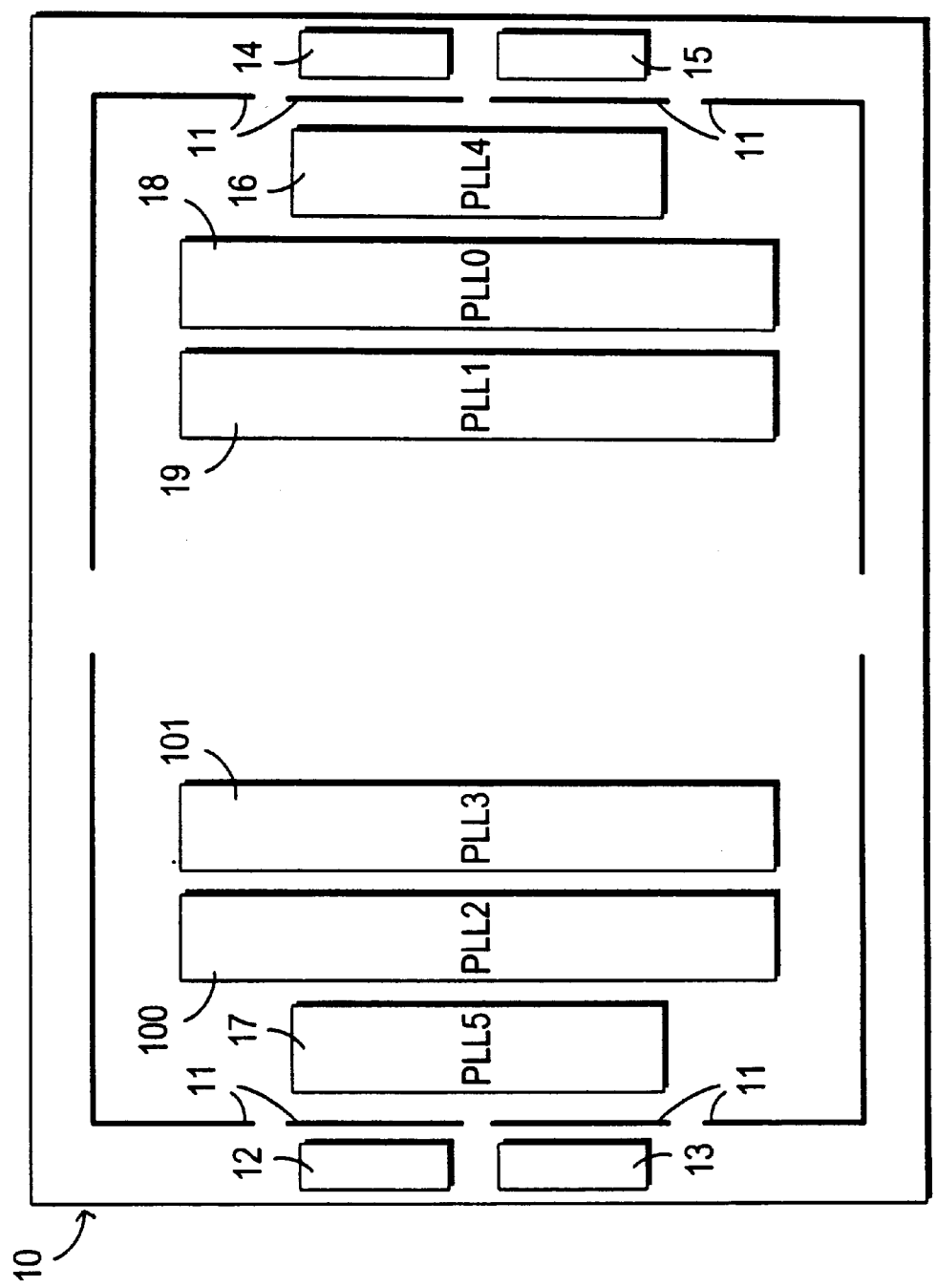
FIG. 1 is a schematic diagram of a preferred embodiment of a programmable logic device incorporating the LVDS interface of this invention.

FIG. 1 shows a schematic overview of a programmable logic device 10 incorporating a preferred embodiment of the invention. Device 10 includes power bus segments 11, which allow the provision of different supply voltages to different groups of input/output interfaces in different parts of device 10, as explained in more detail in copending, commonly-assigned U.S. patent application Ser. Nos. 60/115,216, filed Jan. 8, 1999, and 09/366,938 filed Aug. 4, 1999, which are hereby incorporated by reference in their entireties. As explained in more detail in those incorporated applications, interfaces 12, 13 support LVDS (low voltage differential signalling) inputs, while interfaces 14, 15 support LVDS outputs. Other interfaces (not shown) may support other signalling schemes.

As can be seen in FIG. 1, device 10 preferably includes a plurality of phase-locked loop ("PLL") circuits. PLL circuits 18, 19, 100, 101 (identified as PLL0, PLL1, PLL2, PLL3) preferably are provided for lower-speed LVDS applications, as well as for general use by device 10. PLL circuits 18, 19, 100, 101 preferably can provide frequencies between about 1 MHZ and about 400 MHZ, based on LVDS input clocks at pins 20 and 21, 22 and 23, 24 and 25, and 26 and 27, respectively. As described in more detail below, pins 20, 22, 24, 26 can also receive standard input clocks, and all clock inputs can bypass their respective PLLs at 28, 29, 200, 201.

Figure 2:
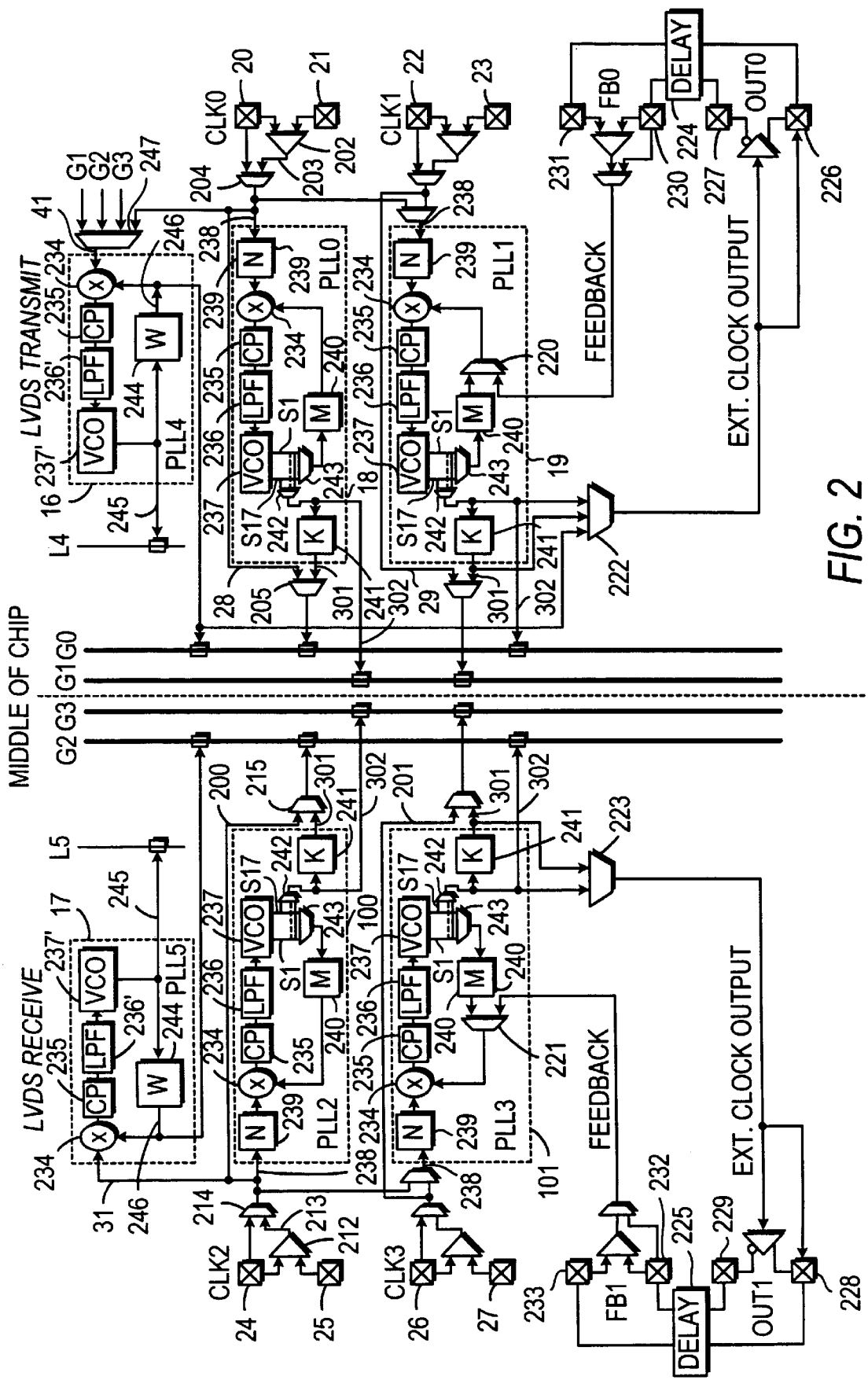
FIG. 2 is a more detailed schematic diagram of the programmable logic device of FIG. 1 showing the phase-locked loop circuitry of the LVDS interface.

PLLs 18 and 100 are shown in schematic form in FIG. 2, and include all of the conventional PLL circuit elements, including a phase/frequency detector 234, a charge pump 235, a low-pass filter 236 and a voltage-controlled oscillator 237 whose output in a traditional PLL is the PLL output and also is fed back to phase/frequency detector 234.

In known PLL operation, phase/frequency detector 234 receives the input clock signal from input terminal 238, and the feedback clock signal from VCO 237, and produces "up" or "down" output signal pulses applied to charge pump 235 depending on whether the phase of the input clock signal leads or lags the phase of the feedback clock signal. The width of the "up" or "down" signal pulses is typically controlled by phase/frequency detector 234 to be proportional to the phase difference between the input and feedback clock signals. Charge pump 235 provides a transfer function of the "up" and "down" signals to an output signal voltage at a level between $V_{cc}$ (the power supply voltage of device 10) and ground. The "up" and "down" signals switch an internal current source to deliver a charge to move the charge pump output signal voltage up or down during each clock cycle.

The output signal of charge pump 235 is applied to low-pass filter 236, which smooths the signal for application as a control signal to the associated voltage-controlled oscillator ("VCO") 237. In sum, when the phase of the input clock signal leads the phase of the feedback clock signal, an "up" signal is generated by phase/frequency detector 234. This results in an increase in the frequency of the feedback clock signal. Conversely, when the phase of the input clock signal lags the phase of the feedback clock signal, phase/frequency detector 234 produces a "down" signal, which causes a decrease in the frequency of the feedback clock signal.

In PLL circuit 18, 100, VCO 237 preferably has seventeen taps, $s_1, \ldots, s_{17}$, any one of which can be used as the output of PLL 18, 100 or the feedback to phase/frequency detector 234. The signal taps preferably are separated from one another in phase by a substantially uniform amount, as described in more detail in copending, commonly-assigned U.S. patent application Ser. Nos. 60/115,238, filed Jan. 8, 1999 and 09/366,940 filed Aug. 4, 1999. Each of the seventeen taps preferably feeds an output multiplexer 242 as well as feedback multiplexer 243, so that any one tap can be selected for output and any one tap can be selected for feedback.

Standard PLL functionality is achieved by tapping tap $s_{17}$ for both feedback and output purposes. However, in accordance with above-incorporated application Ser. Nos. 60/115,238 and 09/366,940, any one of taps $s_1, \ldots, s_{17}$ can be selected as the output and any one of taps $s_1, \ldots, s_{17}$ can be selected for feeding back to phase/frequency detector 234. When the tap selected for the output is a lower-numbered tap than the tap selected for feedback, the output phase is ahead of the input phase by one more phase delay unit than the number of taps between the selected taps. Similarly, when the tap selected for feedback is a lower-numbered tap than the tap selected for the output, the output phase is behind the input phase by one more phase delay unit than the number of taps between the selected taps. As a practical matter, for maximum phase adjustability, $s_1$ preferably is always one of the selected taps.

PLL circuit 18, 100 preferably also includes the three programmable scaling counters 239, 240, 241. Pre-scale counter 239 preferably is programmable, or loadable, with an integer N by which the frequency of any input signal, and ultimately any output signal, is divided. Feedback-scale counter 240 preferably is loadable with an integer M by which the frequency of the feedback signal from multiplexer 243 to phase/frequency detector 234 is divided, resulting in multiplication of the output signal by M. Post-scale counter 241 preferably is loadable with an integer K by which the frequency of the output signal is divided.

Thus, at output 301, an output signal is provided whose frequency is equal to the frequency of the input signal at 238 multiplied by M/(NK). In addition, at alternate output 302, which bypasses post-scale counter 241, an output signal is provided whose frequency is equal to the frequency of the input signal at 238 multiplied by M/N. Although the effect of providing bypass output 302 is the same as setting K=1 (indeed, counters 239, 240 can also be "bypassed" by setting N=1 or M=1), output 302 allows the option of having outputs of two different frequencies. Either output 301, 302 has the same phase relationship to the input signal, which is determined by which taps of VCO 237 are tapped by multiplexers 242, 243, as discussed above.

LVDS output clock CLK0 is received at pins 20 and 21, fed through differential amplifier 202 to produce a clock signal at 203 that is selected by multiplexer 204 for input to PLL0 18, which feeds multiplexer 205. Clock signal 203 is also fed directly to multiplexer 205 by bypass 28. Thus, as determined by the programming of multiplexer 205, clock signal 203 can be fed directly to chip-wide clock conductor G0, or it can be modified first by PLL0 18 (i.e., its frequency and/or phase can be altered as described above) and then fed to conductor G0, while the bypass output 302 is fed to chip-wide clock conductor G1. Pin 20 can also be used for a non-LVDS, single-input clock signal, in which case pin 20 is selected directly by multiplexer 204, and passed directly to conductor G0.

Similarly, the LVDS input clock CLK2 at pins 24, 25 can be fed through differential amplifier 212 to produce a clock signal at 213 that is selected by multiplexer 214 for input to PLL2 100, which feeds multiplexer 215. Clock signal 213 is also fed directly to multiplexer 215 by bypass 200. Thus, as determined by the programming of multiplexer 215, clock signal 213 can be fed directly to chip-wide clock lead G2, or it can be modified first by PLL2 100 (i.e., its frequency and/or phase can be altered as described above) and then fed to conductor G2, while the bypass output 301 is fed to chip-wide clock conductor G3. Pin 24 can also be used for a non-LVDS, single-input clock signal, in which case pin 24 is selected directly by multiplexer 214 and passed directly to conductor G2.

PLL1 19 and PLL3 101 are similar to PLL0 18 and PLL2 100, and operate as described in connection with PLL0 18 and PLL2 100, except that multiplexers 220, 221 are provided to allow user-modified feedback FB0 or FB1, respectively, in place of the feedback from the VCO. In addition, multiplexers 222, 223 allow the post-scaled output 301 or the bypass output 302 to be provided as an external clock output OUT0 or OUT1.

Frequently, output clocks OUT0 and OUT1 can be manipulated by the user and fed back in at FB0 or FB1 to provide the user-modified feedback for PLL1 19 or PLL3 101. For example, the user can interpose a delay 224, 225 in the output clock (OUT0 or OUT1) before feeding the delayed output clock back in at FB0 or FB1. In particular, delay 224, 225 could be the clock network delay of the entire printed circuit board on which programmable logic device 10 is mounted. In this way, the user can use PLL1 19 or PLL3 101 to compensate not only for clock network delay or skew within programmable logic device 10, but also outside device 10 on the printed circuit board. The user would have to give up the ability to multiply the PLL frequency with feedback-scale counter 240, but would gain the advantage of compensating for delay outside device 10.

The output clocks at pins 226 and 227 (OUT0) or 228 and 229 (OUT1) can be LVDS differential signals, in which case both leads 226, 227 or 228, 229 are used, or ordinary signalling, in which case only lead 226 or 228 is used. If the output clocks are LVDS signals, then the feedback signals from delays 224, 225 that are fed back at pins 230 and 231 (FB0) or 232 and 233 (FB1) are LVDS signals as well. Similarly, If the output clocks are not LVDS signals, then the feedback signals from delays 224, 225 are normal signals and only pin 230 or 232 is used to receive the feedback signals.

Phase-locked loop circuits 16, 17 (identified as PLL4 and PLL5) are specialized PLL circuits in accordance with the present invention, designed for use in high-speed LVDS applications.

PLL circuits 16, 17 are similar to PLL circuits 18, 19, having phase/frequency detector 234, charge pump 235, low-pass filter 236 and VCO 237, with feedback to phase/frequency detector 234. In addition, each PLL circuit 16, 17 has a loadable feedback-scale counter 244 similar to counter 240, but loadable with integer W (rather than integer M) whose purpose will become apparent below.

PLL circuits 16, 17 are optimized for very high-frequency operation, up to about at least 622 MHZ, enabling the operation of high-speed LVDS interfaces, as described below, by reducing some of the overhead associated with PLL circuits 18, 19, 100, 101. For example, elimination of the prescale (divide-by-N) and postscale (divide-by-K) counters eliminates overhead and allows higher speeds. In addition, feedback-scale counter 244 (multiply-by-W) can be loaded up to $W_{max}=8$, as opposed to $M_{max}=256$ in the case of feedback-scale counter 240. The limitation on the maximum value of W, which allows higher-speed operation, is possible because normally in high-speed LVDS data transfer (described below), the maximum "word" length is 8. In addition, low-pass filter 236' is modified for fast response time by reducing the size of the capacitors in filter 236' by about 50% as compared to the capacitors in filter 236. Moreover, unlike PLL circuits 18, 19, 100, 101, PLL circuits 16, 17 do not have the overhead of multiplexers 242, 243 (used in the other circuits to adjust relative phase by selecting different taps of VCO 237), and VCO 237' has only 5 stages, rather than 17 stages as in VCO 237, which further improves PLL performance. Finally, PLL circuits 16, 17 need drive only the local LVDS clock network represented by L4, L5, rather than a chip-wide clock network. This reduces both delays and loading, both of which limit speed.

Although there is no programmable selection of the phase difference between the input and output clocks of PLL circuits 16, 17 as there is in PLL circuits 18, 19, 100, 101 where multiplexers 242, 243 allow selection of particular VCO taps, a predetermined phase difference can be selected at the time of fabrication.

The multiplied-by-W clock outputs 245 are conducted to local clock lines L4, L5, respectively. The lower speed clock outputs 246 are available locally, as seen at 41, 31 in FIGS. 4 and 3, and also are conducted to global clock lines G0, G2, respectively, although the global clocks G0, G2 are out of phase with the local clocks 41, 31. This is because PLL circuits 16, 17, which can be tuned to compensate for only one delay at a time, are tuned to compensate for the delays in local LVDS clock networks L4, L5, rather than the delay of the global clock network.

Figure 2A:
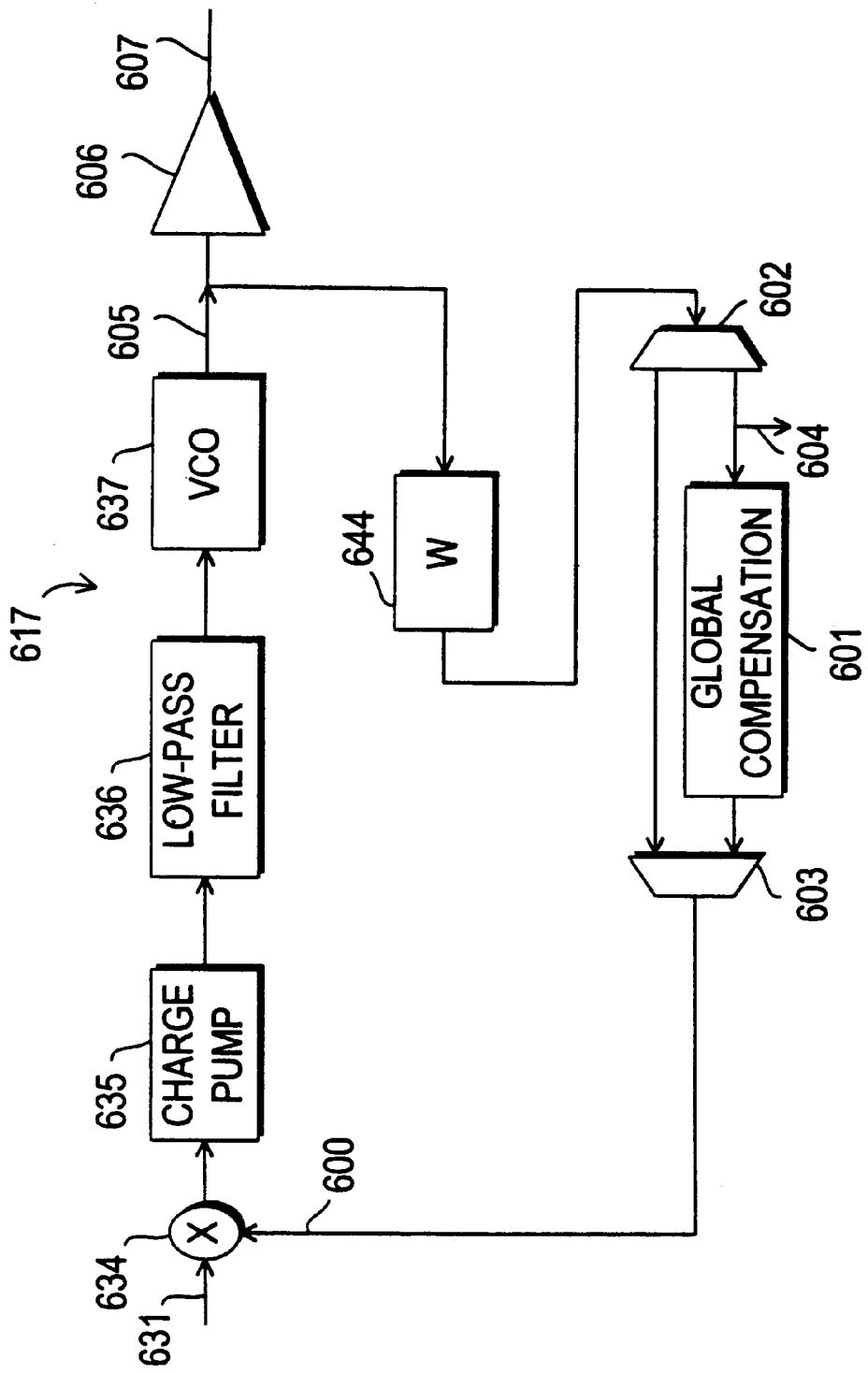
FIG. 2A is an enlarged view of an alternative preferred embodiment of a portion of the programmable logic device of FIGS. 1 and 2.

However, FIG. 2A shows a preferred embodiment of an alternative PLL circuit 617, which is like PLL circuit 17, except that it has been modified to compensate for two delays at the same time. Like PLL circuit 17, PLL circuit 617 has an input 631 which feeds a phase/frequency detector 634 (similar to phase/frequency detector 234), which in turn feeds charge pump 635 (similar to charge pump 235), low-pass filter 636 (similar to low-pass filter 236) and VCO 637 (similar to VCO 237). The output of VCO 637 is fed back to phase/frequency detector 634 at 600 through a feedback-scale counter 644 (similar to feedback-scale counter 244). If PLL circuit 617 is to compensate for the delay of the global network, global compensation circuit 601 is also provided in the feedback loop, switched in or out by multiplexers 603, 603, providing global compensation at output 604.

If the global compensation circuit 601 is in use, then output 605 of VCO 637 will be ahead of input 631 by the global delay. To provide local compensation, buffer 606 is included at output 605 to provide a delay equal to the difference between the global delay and the local delay, so that output 607 is properly compensated for the local delay.

If the user switches in delay 601, global compensation is available at 604, while local compensation is available at 607. If delay 601 is not switched in, local compensation is available at 605. Alternatively (not shown), multiplexers 602, 603 can be omitted, so that global compensation is always provided at 604 and local compensation is always provided at 607, and the user can simply ignore whatever output is not needed.

The discussion above assumes that the feedback-scale counter 644 has a negligible delay. Alternatively, that delay could be factored in to the compensation provided in buffer 606. If the delay of feedback-scale counter 644 is significant enough to provide compensation in buffer 606 for the case when global compensation 601 is in use, then it should be compensated for even when global compensation 601 is not in use. Therefore, instead of a single buffer 606, two different buffers (not shown) can be provided—one to compensate only for the delay of counter 644 and one providing a delay equal to the difference between the global and local delays as above (corrected for the delay of counter 644), with the correct buffer programmably selectable (not shown) depending on whether or not global compensation 601 is in use.

It should be noted that while PLL circuit 617 is shown as a modification of PLL circuit 17, the same modifications can be made to any PLL circuit of programmable logic device 10 to allow compensation for two different delays.

Figure 3:
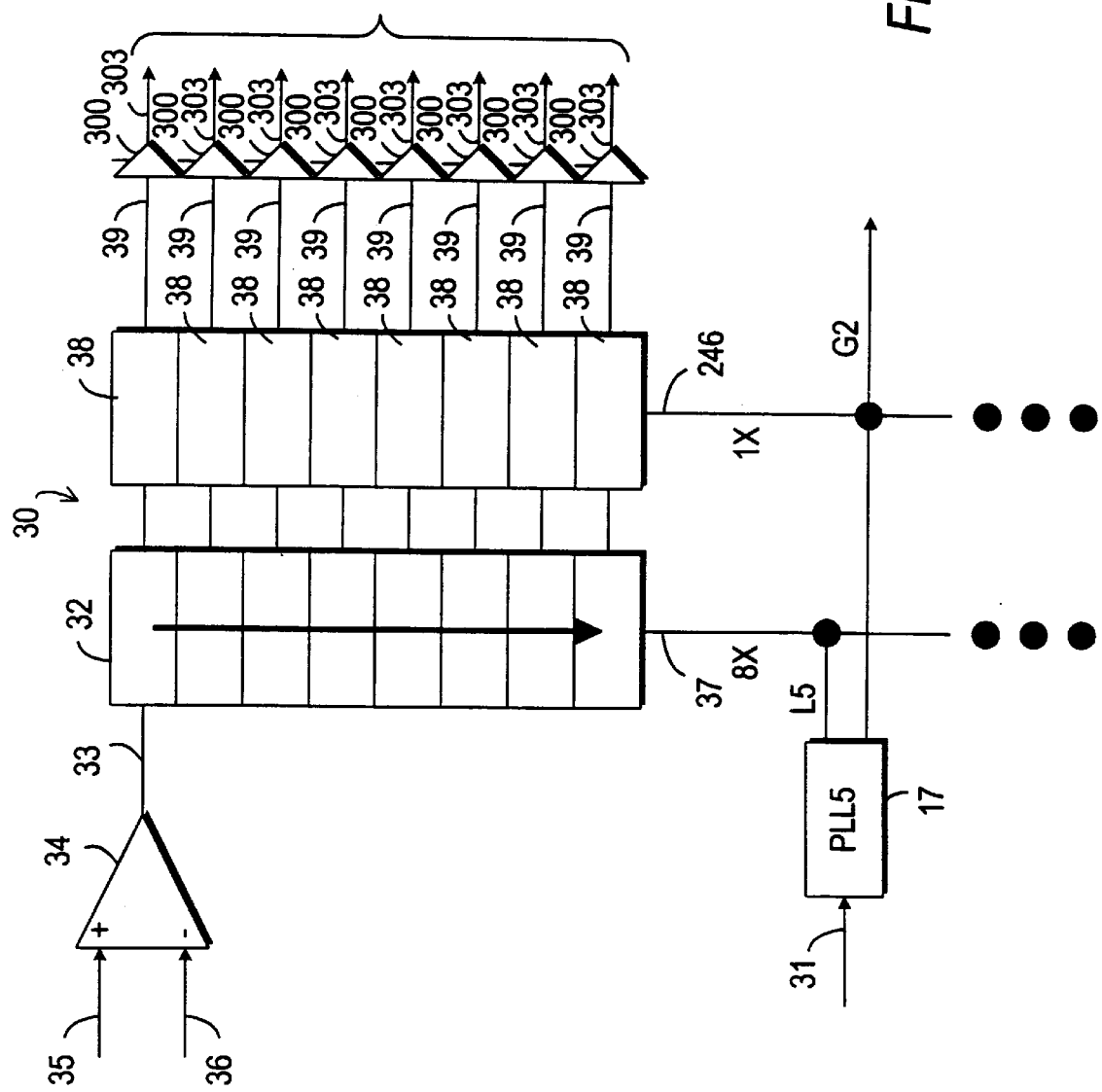
FIG. 3 is a schematic diagram of a preferred embodiment of the LVDS input circuitry of this invention.

A preferred embodiment of LVDS input interface 30 is shown in FIG. 3. Interface 30 preferably is designed for a maximum word length of 8, with 8-bit shift register chain 32 preferably receiving data in a serial input data stream at 33 from LVDS input driver 34, which in turn preferably receives input data from inputs 35 and 36. However, interface 30 could also be designed with a shift register chain of a different length, to accommodate a different maximum word length. Shift register chain 32 preferably is clocked at 37 by "multiplied-by-W" clock L5 output from PLL5 17. PLL5 17 preferably receives an input clock signal at 31 from CLK2 which preferably is input as an LVDS clock on pins 24 and 25. For reasons that will be clear below, providing an 8-bit shift register chain means that W can be any integer up to 8.

Each register in shift register chain 32 preferably has an output connected to one of eight parallel registers 38. Each register 38 in turn preferably has a registered output 39 which is driven by a respective driver 300 onto a signal conductor 303 of programmable logic device 10. The registration of data to registered outputs 39 of registers 38 preferably is controlled by unmultiplied clock 246 output from PLL5 17.

In one cycle of clock 246, clock 37 undergoes W cycles. Thus, in that one cycle of clock 246, W bits are clocked into shift register chain 32 in a serial input data stream, at which time clock 246 undergoes another cycle, and the data in shift register chain 32 are registered in parallel to the outputs of registers 39 whence they are driven in parallel onto conductors 303. It is clear, then, that if W were greater than 8, the system would attempt, in one cycle of clock 246, to clock more bits into shift register chain 32 than there are registers in the chain, meaning that data would be lost. W can be less than eight, but because interface 30 is built with 8 shift registers, that means that the system must ignore bits that are left over in the shift register chain from the previous cycle. This can be accomplished by programming programmable logic device 10 not to use the data in those registers 39 that correspond to "left-over" data in shift registers 32. For example, if W=5, device 10 could be programmed not to use the last three registers 39.

Figure 4:
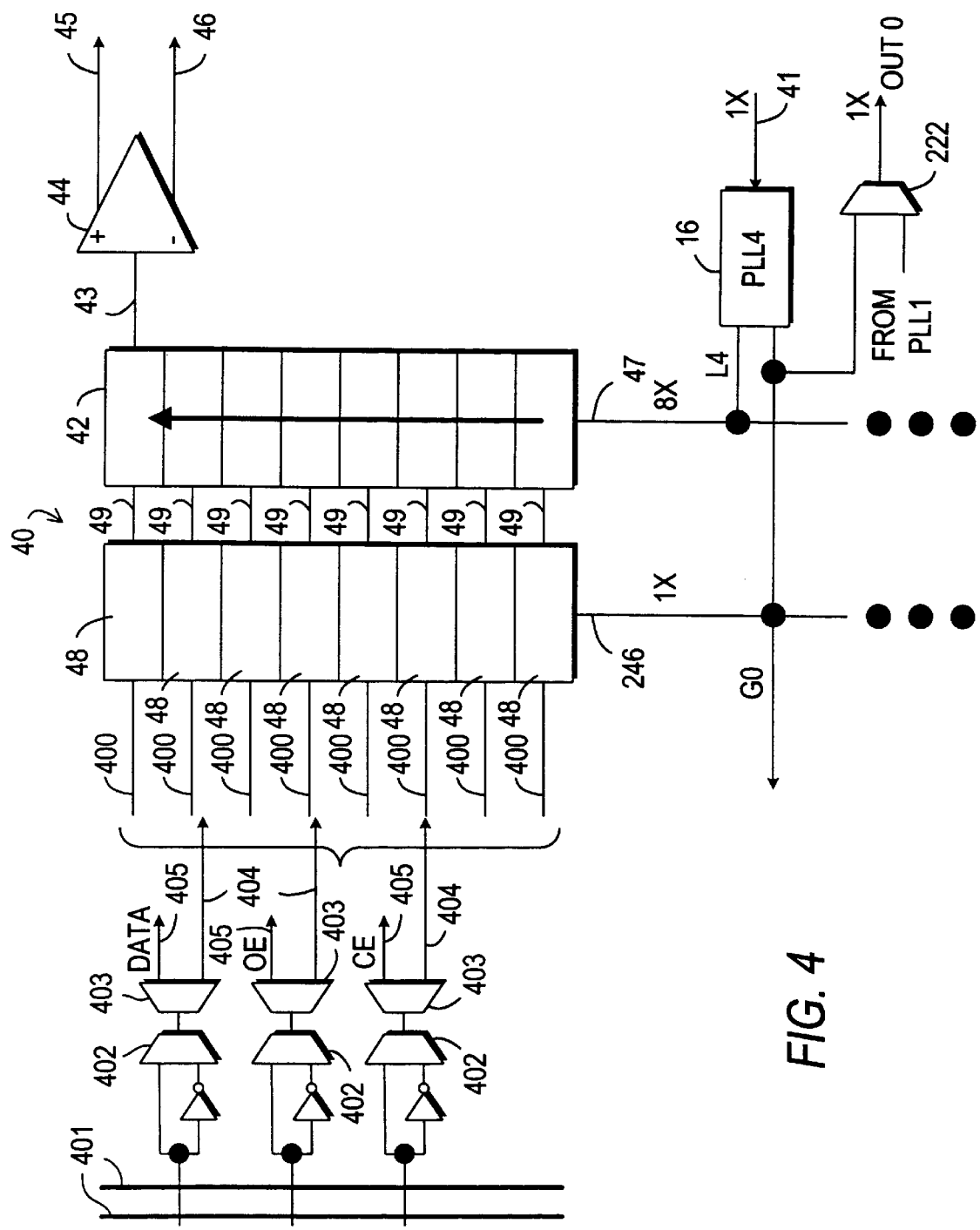
FIG. 4 is a schematic diagram of a preferred embodiment of the LVDS output circuitry of this invention.

A preferred embodiment of LVDS output interface 40 is shown in FIG. 4. Interface 40 preferably is designed for a maximum word length of 8, with 8-bit shift register chain 42 preferably outputting data in a serial output data stream at 43 to LVDS output driver 44, which in turn preferably outputs data at terminals 45 and 46. However, interface 40 could also be designed with a shift register chain of a different length, to accommodate a different maximum word length. Shift register chain 42 preferably is clocked at 47 by "multiplied-by-W" clock L4 output from PLL4 16. PLL4 16 receives an input clock signal at 41 from CLK0 which preferably is input as an LVDS clock on pins 20 and 21. As in the case of input interface 30, providing an 8-bit shift register chain in output interface 40 means that W can be any integer up to 8.

Each register in shift register chain 42 preferably has an input connected to a registered output 49 of one of eight parallel registers 48. Each register 48 preferably also has an input 400 which is driven by data on conductors 401 of programmable logic device 10 as follows. The true or complement, according to user programming, of data on each respective conductor 401 preferably is selected by respective multiplexer 402. Each multiplexer 402 preferably drives a demultiplexer 403 which, on one output 404, preferably drives a register input 400. (Each demultiplexer 403 preferably also has an output 405 which can be selected to drive other circuitry on programmable logic device 10.) The registration of data to registered outputs 49 of registers 48 is controlled by unmultiplied clock output 246 from PLL4 16.

In one cycle of clock 246, clock 47 undergoes W cycles. Thus, in that one cycle of clock 246, W bits are clocked out of shift register chain 42 in a serial output data stream, at which time clock 246 undergoes another cycle, and the data on inputs 400 of registers 48 are registered to outputs 49 which are connected to inputs of the shift registers in shift register chain 42 so that the data are transferred in parallel for the next output cycle. It is clear, then, that if W were greater than 8, the system would attempt, in one cycle of clock 246, to clock more bits out of shift register chain 42 than there are registers in the chain, resulting in gaps in the output serial data stream. In the case of output interface 40, unlike input interface 30, there preferably are no "left over" bits in shift register chain 42 when W is less than eight, because the system preferably would be set up by user programming to load only W bits into registers 48, so that only W shift registers in shift register chain 42 would receive data, all of which would be clocked out in one cycle. If the user did erroneously program device 10 to load data into more than W ones of registers 48, those data would get transferred to shift registers 42, but would not be clocked out of shift registers 42 because only W bits would be clocked out. The left-over bits would then be overwritten as the next W bits are transferred in parallel into shift registers 42.

Finally, in the case of output interface 40, unmultiplied clock 246 is made available at multiplexer 222 as one possibility for output clock OUT0 on pins 226 and 227. This allows a user to use clock 246 to synchronize the LVDS receiver, to which the LVDS output data stream (terminals 45, 46) of device 10 is being sent, to the clock that was used to create the data stream. There is no reason to do the same with the internal clock of input interface 30 because there would not be any use for it outside interface 30. That is why clock networks L4, L5 are independent and need not be in phase.

In one preferred embodiment, W=7 and the unmultiplied clock rate is 66 MHZ, so that the multiplied clock rate is 462 MHZ. In another preferred embodiment, W=8 and the unmultiplied clock rate is 77.75 MHZ, so that the multiplied clock rate is 622 MHZ. These embodiments correspond to the published standard for the LVDS signalling protocol.

According to another aspect of the present invention, as seen in FIG. 2, the clock input 41 to PLL circuit 16 arrives at PLL circuit 16 through multiplexer 247, which allows the selection, as clock input 41, not only of the LVDS input clock on pins 20 and 21, but also of any of global clocks G1, G2, G3. This allows PLL circuit 16, under programmable control of the user, (a) to be cascaded with other PLLs, (b) to be driven directly by an external clock (pins 20, 21), or (c) to be driven by an external clock from one of pins 22 and 23, 24 and 25 or 26 and 27 via bypass conductors 29, 200, 201, multiplexer 215 (or its equivalent) and one of the global clock conductors (this option allows all clock pins to drive PLL circuit 16 without cascade). The same functionality can be provided to any or all of the PLL circuits of device 10 (not shown). This allows greater user flexibility.

Figure 5:
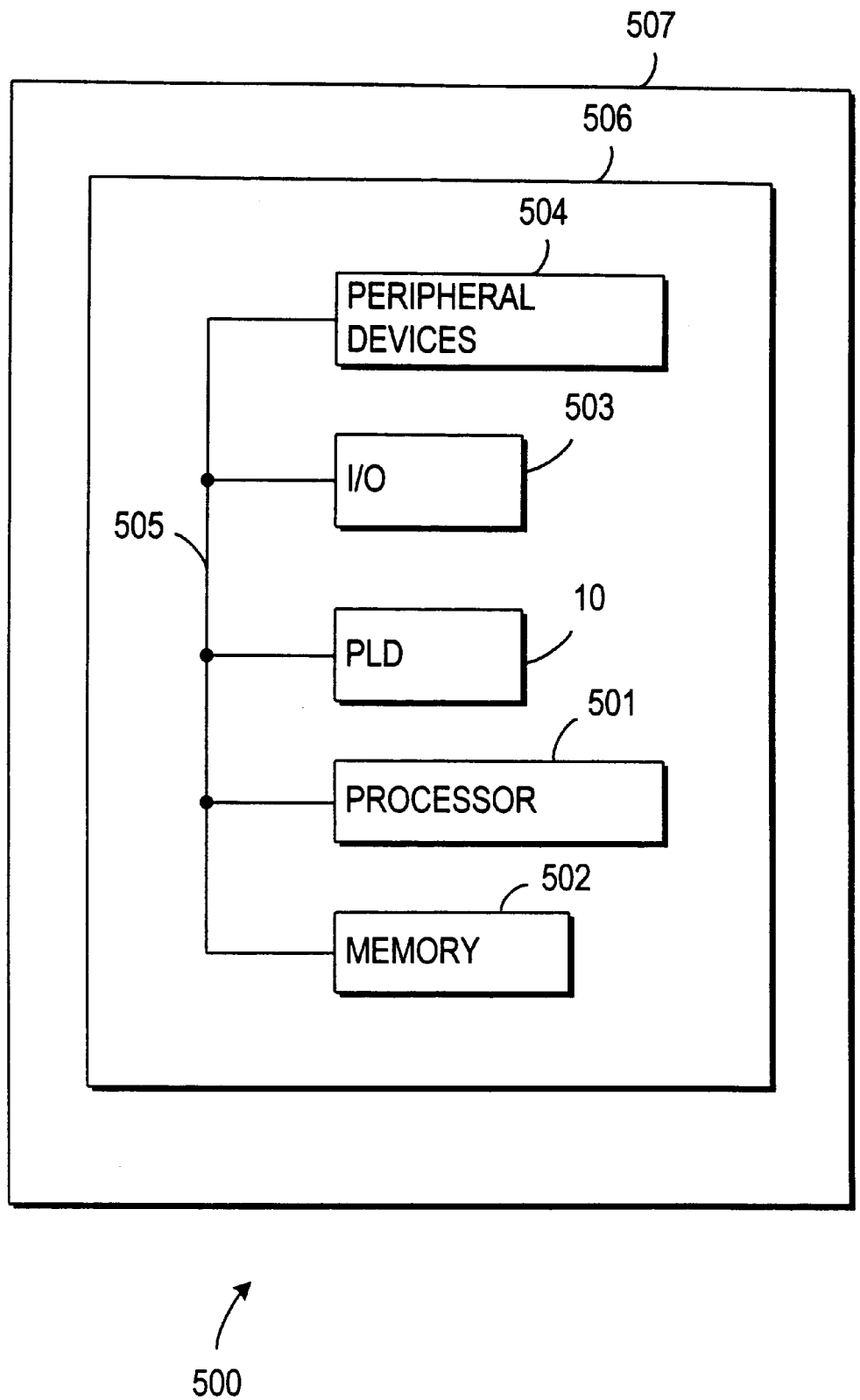
FIG. 5 is a simplified block diagram of an illustrative system employing a programmable logic device incorporating an LVDS interface according to the present invention.

FIG. 5 illustrates a programmable logic device 10 incorporating programmable I/O circuits 20 or 40 configured according to this invention in a data processing system 500. Data processing system 500 may include one or more of the following components: a processor 501; memory 502; I/O circuitry 503; and peripheral devices 504. These components are coupled together by a system bus 505 and are populated on a circuit board 506 which is contained in an end-user system 507.

System 500 can be used in a wide variety of applications, such as computer networking, data networking, instrumentation, video processing, digital signal processing, or any other application where the advantage of using programmable or reprogrammable logic is desirable. Programmable logic device 10 can be used to perform a variety of different logic functions. For example, programmable logic device 10 can be configured as a processor or controller that works in cooperation with processor 501. Programmable logic device 10 may also be used as an arbiter for arbitrating access to a shared resource in system 500. In yet another example, programmable logic device 10 can be configured as an interface between processor 501 and one of the other components in system 500. It should be noted that system 500 is only exemplary, and that the true scope and spirit of the invention should be indicated by the following claims.

Various technologies can be used to implement programmable logic devices 10 employing the LVDS interface 30, 40 according to this invention, as well as the various components of the LVDS interface. Moreover, this invention is applicable to both one-time-only programmable and reprogrammable devices.

Thus it is seen that an LVDS interface for a programmable logic device, which interface includes a phase-locked loop circuit for accurate input/output timing, has been provided. One skilled in the art will appreciate that the present invention can be practiced by other than the described embodiments, which are presented for purposes of illustration and not of limitation, and the present invention is limited only by the claims which follow.

What is claimed is:

1. An LVDS input interface for a programmable logic device, said programmable logic device having a plurality of signal conductors, said LVDS interface comprising:

a pair of input terminals for accepting an input LVDS signal;

an LVDS differential input driver for converting said input LVDS signal into a data signal comprising a serial stream of data bits;

a number of shift registers, said number of shift registers having a shift register input for accepting said serial stream of data bits, each of said shift registers having a shift register output;

a number of second registers, each register in said number of second registers having an input coupled to one of said shift register outputs and having a registered output coupled to one of said signal conductors; and an input phase-locked loop circuit for generating first and second input clock signals having first and second input clock rates, said first input clock rate being a multiple of said second input clock rate, said multiple being equal to said number; wherein:

said first input clock signal controls shifting of said serial stream of data bits into said first shift registers; and said second input clock signal controls registration of said data bits from said inputs of said second registers to said outputs of said second registers; whereby:

on each one cycle of said second clock signal:

an existing set of said number of data bits previously applied by said shift register outputs to said inputs of said second registers are registered to said outputs of said second registers for conduction onto said signal conductors; and said first input clock signal goes through said number of cycles, clocking a new set of said number of data bits into said shift registers, whence they are conducted to said inputs of said second registers.

2. The LVDS interface of claim 1 wherein said second clock rate is up to about at least 622 MHZ.

3. The LVDS interface of claim 2 wherein said second clock rate is about 462 MHZ.

4. The LVDS interface of claim 3 wherein said number is 7 and said first clock rate is about 66 MHZ.

5. The LVDS interface of claim 2 wherein said second clock rate is about 622 MHZ.

6. The LVDS interface of claim 5 wherein said number is 8 and said first clock rate is about 77.75 MHZ.

7. The LVDS interface of claim 1 wherein said input phase-locked loop circuit comprises:

a clock input terminal for accepting an input clock signal having an input frequency;

a phase/frequency detector having a signal input connected to said clock input terminal, a phase detection input and a signal output;

a charge pump having a pump input connected to said signal output of said phase/frequency detector and having a pump output;

a low-pass filter having a filter input connected to said pump output and having a filter output;

a voltage-controlled oscillator having an oscillator input connected to said filter output, and an oscillator output which is a first clock output of said phase-locked loop;

a feedback loop feeding a feedback signal back to said phase detection input, said feedback loop comprising a feedback-scale counter loaded with said number, causing said oscillator output to have an output frequency equal to said input frequency multiplied by said number; and a bypass output from said feedback loop downstream of said counter, for providing a second clock output of said phase-locked loop, said second clock output being in phase-locked relationship with said first clock output but having a frequency equal to said input frequency.

8. An LVDS output interface for a programmable logic device, said programmable logic device having a plurality of signal conductors, said interface comprising:

a number of first registers, each register in said number of first registers having an input coupled to one of said signal conductors and having a registered output;

a number of shift registers, each shift register in said number of shift registers having an input coupled to one of said registered outputs, said number of shift registers having a shift register output for providing a serial stream of data bits;

an output phase-locked loop circuit for generating first and second output clock signals having first and second output clock rates, said second output clock rate being a multiple of said first output clock rate, said multiple being equal to said number;

an LVDS differential output driver for converting said serial stream of data bits into an output LVDS signal; and a pair of output terminals for providing said output LVDS signal; wherein:

said first output clock signal controls registration of said data bits from said inputs of said first registers to said registered outputs, whence they are conducted to said inputs of said shift registers; and said second output clock signal controls shifting of said data bits out of said shift registers as said serial stream of data bits; whereby:

on each one cycle of said first output clock signal:

said second output clock signal goes through said number of cycles, clocking a set of said number of data bits out of said shift registers as said serial stream of data bits; and an existing set of said number of data bits previously conducted by said signal conductors into said first registers are registered to said registered outputs of said first registers whence they are conducted to said shift registers, while a new set of said number of data bits are conducted into said inputs of said first registers by said signal conductors.

9. The LVDS interface of claim 8 wherein said second clock rate is up to about at least 622 MHZ.

10. The LVDS interface of claim 9 wherein said second clock rate is about 462 MHZ.

11. The LVDS interface of claim 10 wherein said number is 7 and said first clock rate is about 66 MHZ.

12. The LVDS interface of claim 9 wherein said second clock rate is about 622 MHZ.

13. The LVDS interface of claim 12 wherein said number is 8 and said first clock rate is about 77.75 MHZ.

14. The LVDS interface of claim 8 wherein said output phase-locked loop circuit comprises:

a clock input terminal for accepting an input clock signal having an input frequency;

a phase/frequency detector having a signal input connected to said clock input terminal, a phase detection input and a signal output;

a charge pump having a pump input connected to said signal output of said phase/frequency detector and having a pump output;

a low-pass filter having a filter input connected to said pump output and having a filter output;

a voltage-controlled oscillator having an oscillator input connected to said filter output, and an oscillator output which is a first clock output of said phase-locked loop;

a feedback loop feeding a feedback signal back to said phase detection input, said feedback loop comprising a feedback-scale counter loaded with said number, causing said oscillator output to have an output frequency equal to said input frequency multiplied by said number; and a bypass output from said feedback loop downstream of said counter, for providing a second clock output of said phase-locked loop, said second clock output being in phase-locked relationship with said first clock output but having a frequency equal to said input frequency.

15. A programmable logic device comprising:

a plurality of programmable logic regions;

a plurality of conductors for conducting signals to, from and among said plurality of programmable logic regions; and an LVDS input interface comprising:

a pair of input terminals for accepting an input LVDS signal, an LVDS differential input driver for converting said input LVDS signal into a data signal comprising a serial stream of input data bits, a first number of input shift registers, said first number of input shift registers having an input shift register input for accepting said serial stream of input data bits, each of said input shift registers having an input shift register output, a first number of second input registers, each register in said first number of second input registers having an input coupled to one of said input shift register outputs and having a registered output coupled to one of said signal conductors, and an input phase-locked loop circuit for generating first and second input clock signals having first and second input clock rates, said first input clock rate being a first multiple of said second input clock rate, said first multiple being an integer at most equal to said first number; wherein:

said first input clock signal controls shifting of said serial stream of input data bits into said input shift registers; and said second input clock signal controls registration of said input data bits from said inputs of said second input registers to said outputs of said second input registers; whereby:

on each one cycle of said second clock signal:

an existing set of said first number of input data bits previously applied by said input shift register outputs to said inputs of said second input registers are registered to said outputs of said second input registers for conduction onto said signal conductors; and said first input clock signal goes through said first multiple of cycles, clocking a new set of said first multiple of input data bits into said input shift registers, whence they are conducted to said inputs of said second input registers.

16. The programmable logic device of claim 15 wherein said input phase-locked loop circuit comprises:

an input clock input terminal for accepting an input clock input signal having an input clock input frequency;

an input phase/frequency detector having a signal input connected to said input clock input terminal, an input phase detection input and an input signal output;

an input charge pump having an input pump input connected to said input signal output of said input phase/frequency detector and having an input pump output;

an input low-pass filter having an input filter input connected to said input pump output and having an input filter output;

an input voltage-controlled oscillator having an input oscillator input connected to said input filter output, and an input oscillator output which is a first input clock output of said input phase-locked loop;

an input feedback loop feeding an input feedback signal back to said input phase detection input, said input feedback loop comprising an input feedback-scale counter loaded with said first multiple, causing said input oscillator output to have an input clock output frequency equal to said input clock input frequency multiplied by said first multiple; and a first bypass output from said input feedback loop downstream of said input feedback-scale counter, for providing a second input clock output of said input phase-locked loop, said second input clock output being in phase-locked relationship with said first input clock output but having a frequency equal to said input frequency.

17. The programmable logic device of claim 15 further comprising an LVDS output interface comprising:

a second number of first output registers, each register in said second number of first output registers having an input coupled to one of said signal conductors and having a registered output;

a second number of output shift registers, each output shift register in said second number of output shift registers having an input coupled to one of said output register registered outputs, said second number of output shift registers having an output shift register output for providing a serial stream of output data bits;

an output phase-locked loop circuit for generating first and second output clock signals having first and second output clock rates, said second output clock rate being a second multiple of said first output clock rate, said second multiple being an integer at most equal to said second number;

an LVDS differential output driver for converting said serial stream of output data bits into an output LVDS signal; and a pair of output terminals for providing said output LVDS signal; wherein:

said first output clock signal controls registration of said output data bits from said inputs of said first output registers to said output register registered outputs, whence they are conducted to said inputs of said output shift registers; and said second output clock signal controls shifting of said output data bits out of said output shift registers as said serial stream of output data bits; whereby:

on each one cycle of said first output clock signal:

said second output clock signal goes through said second multiple of cycles, clocking a set of said second multiple of output data bits out of said output shift registers as said serial stream of output data bits; and an existing set of said second multiple of output data bits previously conducted by said signal conductors into said first output registers are registered to said registered outputs of said first output registers whence they are conducted to said output shift registers, while a new set of said second multiple of data bits are conducted into said inputs of said first output registers by said signal conductors.

18. The programmable logic device of claim 17 wherein said output phase-locked loop circuit comprises:

an output clock input terminal for accepting an output clock input signal having an output clock input frequency;

an output phase/frequency detector having an output signal input connected to said output clock input terminal, an output phase detection input and an output signal output;

an output charge pump having an output pump input connected to said signal output of said output phase/frequency detector and having an output pump output;

an output low-pass filter having an output filter input connected to said output pump output and having an output filter output;

an output voltage-controlled oscillator having an output oscillator input connected to said output filter output, and an output oscillator output which is a first clock output of said output phase-locked loop;

an output feedback loop feeding back an output feedback signal to said output phase detection input, said output feedback loop comprising an output feedback-scale counter loaded with said second multiple, causing said output oscillator output to have an output clock output frequency equal to said output clock input frequency multiplied by said second multiple; and an output bypass output from said output feedback loop downstream of said output feedback-scale counter, for providing a second clock output of said output phase-locked loop, said second clock output of said output phase-locked loop being in phase-locked relationship with said first clock output of said output phase-locked loop but having a frequency equal to said output clock input frequency.

19. A programmable logic device comprising:

a plurality of programmable logic regions;

a plurality of conductors for conducting signals to, from and among said plurality of programmable logic regions; and an LVDS output interface comprising:

a number of first registers, each register in said number of first registers having an input coupled to one of said signal conductors and having a registered output, a number of shift registers, each shift register in said number of shift registers having an input coupled to one of said registered outputs, said number of shift registers having a shift register output for providing a serial stream of data bits;

an output phase-locked loop circuit for generating first and second output clock signals having first and second output clock rates, said second output clock rate being a multiple of said first output clock rate, said multiple being an integer at most equal to said number, an LVDS differential output driver for converting said serial stream of data bits into an output LVDS signal, and a pair of output terminals for providing said output LVDS signal; wherein:

said first output clock signal controls registration of said data bits from said inputs of said first registers to said registered outputs, whence they are conducted to said inputs of said shift registers; and said second output clock signal controls shifting of said data bits out of said shift registers as said serial stream of data bits; whereby:

on each one cycle of said first output clock signal:

said second output clock signal goes through said multiple of cycles, clocking a set of said multiple of data bits out of said shift registers as said serial stream of data bits; and an existing set of said multiple of data bits previously conducted by said signal conductors into said first registers are registered to said registered outputs of said first registers whence they are conducted to said shift registers, while a new set of said multiple of data bits are conducted into said inputs of said first registers by said signal conductors.

20. The programmable logic device of claim 19 wherein said output phase-locked loop circuit comprises:

a clock input terminal for accepting a clock input signal having a clock input frequency;

a phase/frequency detector having a signal input connected to said clock input terminal, a phase detection input and a signal output;

a charge pump having a pump input connected to said signal output of said phase/frequency detector and having a pump output;

a low-pass filter having a filter input connected to said pump output and having a filter output;

a voltage-controlled oscillator having an oscillator input connected to said filter output, and an oscillator output which is a first clock output of said phase-locked loop;

a feedback loop feeding back a feedback signal to said phase detection input, said feedback loop comprising a feedback-scale counter loaded with said multiple, causing said oscillator output to have a clock output frequency equal to said clock input frequency multiplied by said multiple; and a bypass output from said feedback loop downstream of said feedback-scale counter, for providing a second clock output of said phase-locked loop, said second clock output of said phase-locked loop being in phase-locked relationship with said first clock output of said phase-locked loop but having a frequency equal to said clock input frequency.

21. A digital processing system comprising:

processing circuitry;

a memory coupled to said processing circuitry; and a programmable logic device as defined in claim 15 coupled to the processing circuitry and the memory.

22. A digital processing system comprising:

processing circuitry; a memory coupled to said processing circuitry; and a programmable logic device as defined in claim 17 coupled to the processing circuitry and the memory.

23. A digital processing system comprising:

processing circuitry;

a memory coupled to said processing circuitry; and a programmable logic device as defined in claim 19 coupled to the processing circuitry and the memory.

24. A printed circuit board on which is mounted a programmable logic device as defined in claim 15.

25. The printed circuit board defined in claim 24 further comprising:

a memory mounted on the printed circuit board and coupled to the memory circuitry.

26. The printed circuit board defined in claim 24 further comprising:
processing circuitry mounted on the printed circuit board and coupled to the memory circuitry.

27. A printed circuit board on which is mounted a programmable logic device as defined in claim 17.

28. The printed circuit board defined in claim 27 further comprising:
a memory mounted on the printed circuit board and coupled to the memory circuitry.

29. The printed circuit board defined in claim 27 further comprising:
processing circuitry mounted on the printed circuit board and coupled to the memory circuitry.

30. A printed circuit board on which is mounted a programmable logic device as defined in claim 19.

31. The printed circuit board defined in claim 30 further comprising:
a memory mounted on the printed circuit board and coupled to the memory circuitry.

32. The printed circuit board defined in claim 30 further comprising:
processing circuitry mounted on the printed circuit board and coupled to the memory circuitry.

33. A programmable logic device comprising:
a plurality of programmable logic regions;
a plurality of conductors for conducting signals to, from and among said plurality of programmable logic regions, said plurality of conductors including clock conductors for conducting clock signals; and
a plurality of phase-locked loop circuits for generating clock signals, each of said phase-locked loop circuits having a clock input; wherein:
said programmable logic device has respective clock input pins for each respective one of said phase-locked loop circuits for receiving respective external clock signals for driving said clock input of each said respective phase-locked loop circuit;
at least a first one of said phase-locked loop circuits has an output that drives an output clock signal onto one of said clock conductors; and
said programmable logic device further comprises at least one multiplexer, at the clock input of a second one of said phase-locked loop circuits, receiving signals from at least one of said clock input pins and from said one of said clock conductors, for selecting, to drive said second one of said phase-locked loop circuits, one of (a) one of said external clock signals, and (b) said output clock of one of said at least a first one of said phase-locked loop circuits.

34. A digital processing system comprising:
processing circuitry;
a memory coupled to said processing circuitry; and
a programmable logic device as defined in claim 33 coupled to the processing circuitry and the memory.

35. A printed circuit board on which is mounted a programmable logic device as defined in claim 33.

36. The printed circuit board defined in claim 35 further comprising:
a memory mounted on the printed circuit board and coupled to the memory circuitry.

37. The printed circuit board defined in claim 35 further comprising:
processing circuitry mounted on the printed circuit board and coupled to the memory circuitry.

38. A programmable logic device comprising:
a plurality of programmable logic regions;
a plurality of conductors for conducting signals to, from and among said plurality of programmable logic regions, said plurality of conductors including clock conductors for conducting clock signals; and
a plurality of phase-locked loop circuits for generating clock signals, each of said phase-locked loop circuits having a respective clock input, a respective feedback path-and at least a respective local output driving a respective local clock network having a respective local delay; wherein:
at least one of said phase-locked loop circuits has a second output that drives an output clock signal onto one of said clock conductors, said one of said clock conductors conducting said output clock signal to a global clock network characterized by a global delay; and
said at least one of said phase-locked loop circuits comprises:
a first compensation circuit in said feedback path for compensating for said global delay, and
a second compensation circuit at said local output providing a delay substantially equal to a difference between said global delay and said local delay; whereby:
said at least one of said phase-locked loop circuits aligns said input clock simultaneously to said local clock network and to said global clock network.

39. The programmable logic device of claim 38 wherein said at least one phase-locked loop circuit further comprises:
a bypass lead for bypassing said second compensation circuit; and
at least one programmable switch for programmably selecting between said bypass lead and said second compensation circuit.

40. The programmable logic device of claim 39 wherein said at least one programmable switch comprises two multiplexers.

41. A digital processing system comprising:
processing circuitry;
a memory coupled to said processing circuitry; and
a programmable logic device as defined in claim 38 coupled to the processing circuitry and the memory.

42. A printed circuit board on which is mounted a programmable logic device as defined in claim 38.

43. The printed circuit board defined in claim 42 further comprising:
a memory mounted on the printed circuit board and coupled to the memory circuitry.

44. The printed circuit board defined in claim 42 further comprising:
processing circuitry mounted on the printed circuit board and coupled to the memory circuitry.

* * * * *